United States Patent
Yu et al.

(10) Patent No.: US 6,287,968 B1
(45) Date of Patent: Sep. 11, 2001

(54) METHOD OF DEFINING COPPER SEED LAYER FOR SELECTIVE ELECTROLESS PLATING PROCESSING

(75) Inventors: Allen S. Yu, Fremont; Paul J. Steffan, Elk Grove; Thomas C. Scholer, San Jose, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/225,175

(22) Filed: Jan. 4, 1999

(51) Int. Cl.$^7$ .................................................. H01L 21/44
(52) U.S. Cl. ........................... 438/675; 438/678; 438/643
(58) Field of Search .................................... 438/629, 678, 438/675, 643; 427/96, 97

(56) References Cited

U.S. PATENT DOCUMENTS

| | | | |
|---|---|---|---|
| 5,354,712 | * 10/1994 | Ho et al. | 437/195 |
| 5,654,245 | * 8/1997 | Allen | 438/629 |
| 5,670,425 | * 9/1997 | Schinella et al. | 437/195 |
| 5,674,787 | * 10/1997 | Zhao et al. | 437/230 |
| 5,695,810 | * 12/1997 | Dubin et al. | 427/96 |
| 5,895,261 | * 4/1999 | Schinella et al. | 438/586 |
| 6,001,415 | * 12/1999 | Nogami et al. | 427/97 |
| 6,010,962 | * 1/2000 | Liu et al. | 438/687 |
| 6,136,693 | * 10/2000 | Chan et al. | 438/633 |
| 6,140,234 | * 10/2000 | Uzoh et al. | 438/678 |

OTHER PUBLICATIONS

Wolf et al.; Silicon Processing for the VLSI Era, vol. 2: Process Integration; Lattice Press: Sunset Beach, CA, pp. 254–257, 1990.*

* cited by examiner

*Primary Examiner*—Charles Bowers
*Assistant Examiner*—Erik Kielin
(74) *Attorney, Agent, or Firm*—H. Donald Nelson

(57) ABSTRACT

A method of manufacturing semiconductor wafers using electroless plating processing. A partially completed semiconductor wafer having trenches and vias formed in a layer of interlayer dielectric has a barrier layer globally formed on the surface of the partially completed semiconductor wafer. A seed layer is globally formed on the surface of the barrier layer. The barrier and seed layers are removed from portions of the surface of the partially completed semiconductor wafer on which plating is not to occur. The partially completed semiconductor wafer is then subjected to an electroless plating process and conductive material is plated on those portions of the seed layer that remains on the partially completed semiconductor wafer.

2 Claims, 5 Drawing Sheets

METHOD OF DEFINING COPPER SEED LAYER FOR SELECTIVE ELECTROLESS PLATING PROCESSING

BACKGROUND OF THE INVENTION

1. Field of the Invention

This invention relates generally to a method of manufacturing high performance semiconductor devices utilizing selective electroless plating processing and more specifically, this invention relates to a method of manufacturing high performance semiconductor devices utilizing a method of defining copper seed layers for selective electroless plating processing.

2. Discussion of the Related Art

As the performance of semiconductor devices have progressed to higher speeds, the use of aluminum as an interconnect material is causing a speed bottleneck Alternate materials such as gold (Au), silver (Ag), nickel (Ni), palladium (Pd), copper (Cu), and platinum (Pt) have all been explored. Of these, copper has become the preferred alternate replacement due to its low resistance and low cost. However, unlike aluminum, copper is not easily etched into wires or via plugs. An alternative method for manufacturing integrated circuits using multilevel copper interconnects has been developed that utilizes single damascene mask methodology.

As the price of semiconductor devices continues to decrease, there is pressure on the semiconductor manufacturing industry to minimize total cost. One of the major requirements to minimize total cost is to minimize the number of process steps. One method to minimize the number of processing steps is to combine the filling of conductive layers of metallization, for example, into both a trench and a via in a single step. Because current and future devices may have five or more layers of metallization (wire and via equal to one layer), combining the two will have a significant impact upon the total cost of the semiconductor device. Furthermore, the use of copper reduces contact resistance since this will eliminate every other barrier, glue, and seal layers between the current layer's via and wire, as shown in FIG. 1.

Figure 1:
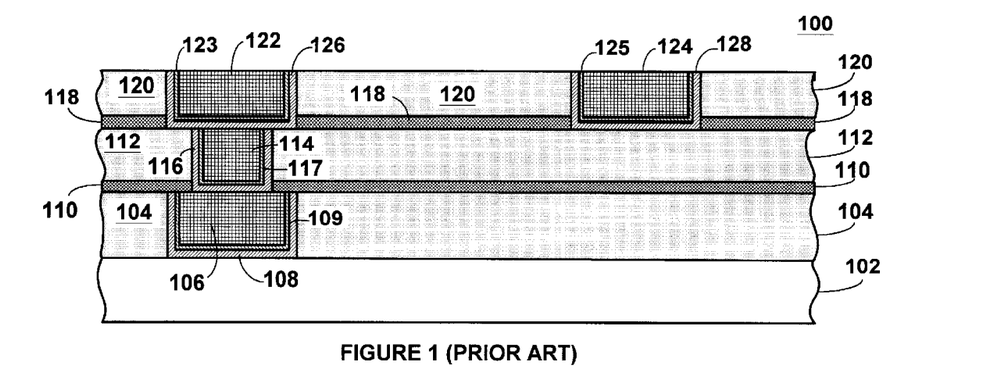
FIG. 1 shows a semiconductor device in which vias and wire interconnects have been formed by standard damascene methods.

FIG. 1 shows a semiconductor device 100 in which vias and wire interconnects have been formed by standard damascene methods. The semiconductor device 100 includes a layer 102 that could be a semiconductor substrate on and in which active devices (not shown) have been formed. The next layer 104 is a layer of interlayer dielectric in which metal structures, such as a wire 106 is formed. As is known in the semiconductor manufacturing art, a wire is used to connect one portion of a semiconductor device to another portion of the semiconductor device on the same layer. The wire 106 is typically formed in a trench formed in the layer of interlayer dielectric 104. The walls of the trench are covered with a barrier layer 108. The barrier layer 108 is typically formed from a metallic nitride material such as TiN or TaN. The trench is then filled with a conductive material. Conductive materials that can be used to fill the trench include tungsten, aluminum and copper. If copper is to be the conductive material to fill the trench, a seed layer 109 is formed on the barrier layer 108. The seed layer is typically a thin layer of copper that may be sputtered onto the barrier layer 108. A seal layer or hard mask layer 110 is formed on the surface of the layer 104 of interlayer dielectric. The layer 110 is a seal layer if the conductive material is to be copper. A seal layer prevents copper ions from diffusing into the surrounding material. A typical seal layer is made up of a material such as $Si_zN_y$ or $SiO_zN_y$. A layer 112 of interlayer dielectric is formed on the layer 110 and metal structures such as via 114 are formed in the layer 112 of interlayer dielectric. The walls of via 114 are covered with a barrier layer 116 similar to barrier layer 108. If via 114 is to be filled with copper, a seed layer 117 is formed on the barrier layer 116. Via 114 is then filled with a conductive material. A seal layer or hard mask layer 118 is formed on the surface of the layer 112 of interlayer dielectric. The layer 118 is a seal layer if the via 114 is to be filled with copper. A layer 120 of interlayer dielectric is formed on the layer 118. Trenches shown at 122 and 124 are formed in the layer 120 of interlayer dielectric. Barrier layers 126 and 128 are formed on the walls of the trenches 122 and 124 respectively and the trenches 122 and 124 are filled with conductive material. If the trenches 122 and 124 are to be filled with copper, seed layers 123 and 125 are formed on the barrier layers 126 and 128. As is known in the semiconductor manufacturing art, trenches and vias are etched into a layer of interlayer dielectric material and a blanket layer of conductive material is then typically formed on the surface of the wafer and a polishing process, such as a chemical mechanical polishing process, is conducted to remove unwanted conductive material. As can be appreciated, the above process of forming individual-metal structures requires numerous steps.

Figure 2A:
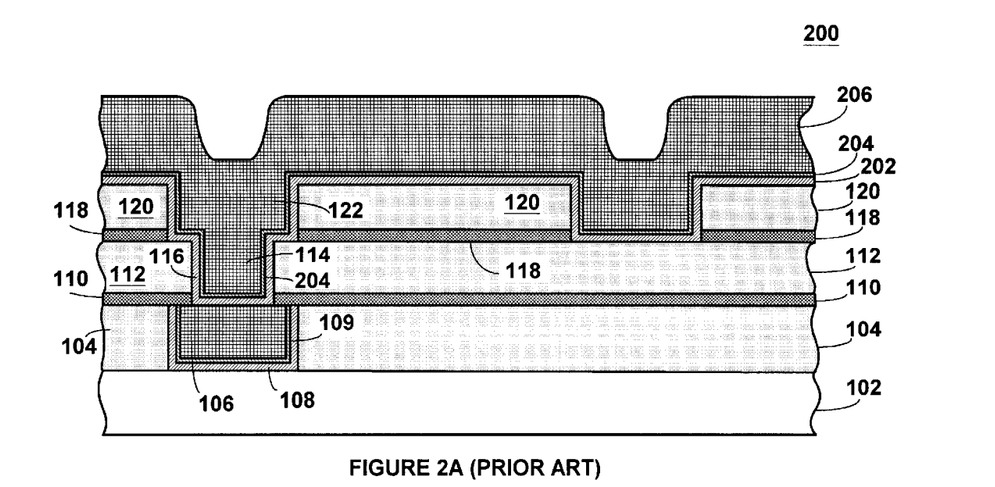
FIG. 2A shows a portion of a partially completed semiconductor wafer showing a thick layer of copper formed on the surface of the wafer.
Figure 2B:
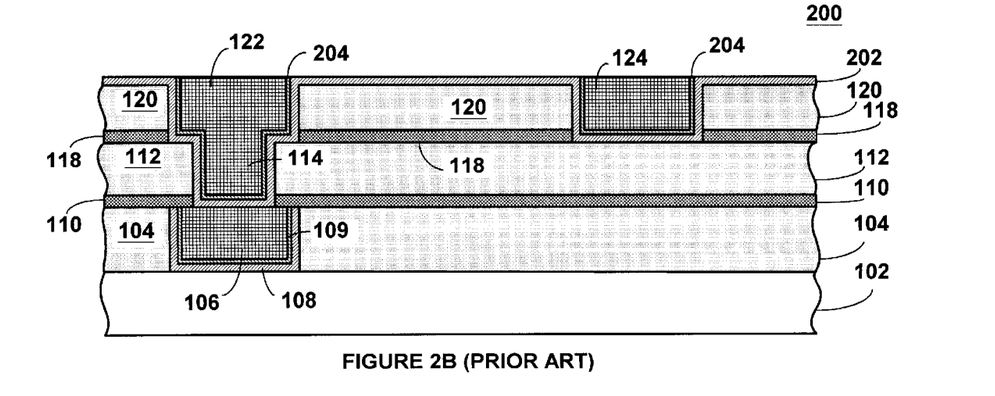
FIG. 2B shows the portion of the partially completed semiconductor wafer as shown in FIG. 2A after a polishing process to polish the thick layer of copper, including the seed layer, formed on the surface of the wafer down to the barrier layer.
Figure 2C:
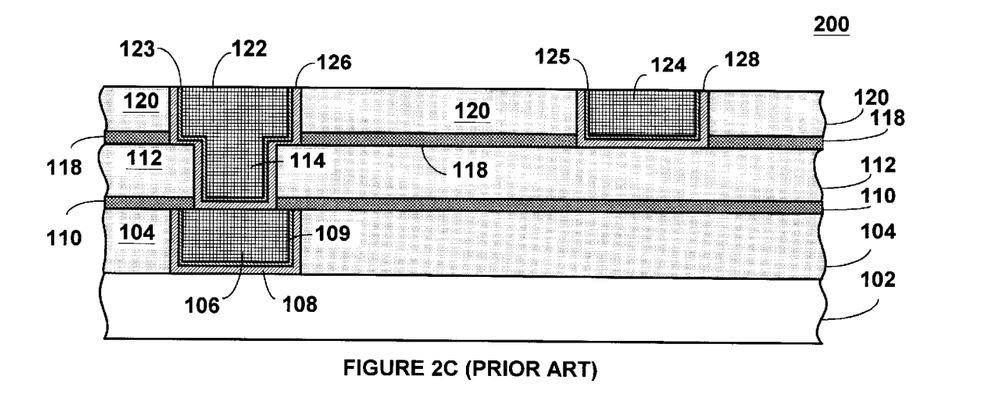
FIG. 2C shows the portion of the partially completed semiconductor wafer as shown in FIG. 2B after a polishing process to polish the barrier layer down to the surface of the semiconductor wafer.

FIGS. 2A–2C show a method of eliminating several steps from the process of forming a semiconductor device as described above in conjunction with FIG. 1. Like numerical designations denote like structures in the figures. FIG. 2A shows a partially completed semiconductor device 200. The partially completed semiconductor device 200 shows layer 102 with metal structure 106 formed in layer 104 of interlayer dielectric. The metal structure 106 is formed by forming a via or trench in the layer 104, forming a barrier layer 108 on the walls of the via or trench in the layer 104, and forming a seed layer 109 on the barrier layer 108 if the via or trench in the layer 104 is to be filled with copper. The seal layer or hard mask layer 110, the layer 112 of interlayer dielectric, the seal layer or hardmask layer 118 and the layer 120 of interlayer dielectric are formed on the layer 104. The layer 110 is a seal layer if the subsequently formed vias and trenches are to be filled with copper. A series of masking and etching processes are then conducted to form vias, such as the via 114 and trenches, such as the trenches 122 and 124, in the layers 104, 110, 112, 118, and 120. A barrier layer 202 is formed on the walls of the vias and trenches. A seed layer 204 of copper is formed on the barrier layer 202 if via 114 and trenches 122 and 124 are to be filled with copper. There are several methods to deposit copper, however, only two of the methods can successfully form copper into the small geometries required for modern semiconductor technology. These two methods are chemical vapor deposition (CVD) and electroplating. Of the two, CVD is too expensive because of the gases used to supply the copper ions. Electroplating is the preferred method because electroplating can be done in batches, unlike a CVD process, which can only be done on one wafer at a time. When an electroplating process is utilized, the seed layer 204 of copper is formed on the barrier layer 202. In this instance, a global deposition or sputtering of the conductive seed layer 204 is formed on the entire surface of the wafer. If the conductive material to be used is copper, the seed layer formation process consists of depositing or sputtering a thin layer of copper onto the entire wafer, which includes the sidewalls and bottom of the trenches and vias that have been formed in the semiconductor device 200. The entire wafer is then submerged into a bath of ionic solution containing copper ions and an electroplating process causes a layer 206 of copper to be formed on the surface of the wafer. It is noted that the thickness of the layer 206 must be thick enough so that via 114 and trench 122 can be completely filled. Because some materials such as copper are difficult to polish, the process of planarizing the copper layer 206 is very difficult.

FIG. 2B shows the partially completed semiconductor device 200 as shown in FIG. 2A after a polishing process to remove undesired portions of the layer 206 of copper and of the seed layer 204. However, as known in the semiconductor manufacturing art, the polishing of copper is a difficult process and it is therefore desirable to keep the thickness of the layer 206 of copper to a minimum.

FIG. 2C shows the partially completed semiconductor device 200 as shown in FIG. 2B after a polishing process to remove undesired portions of the barrier layer 202 from the top surfaces of the partially completed semiconductor device 200. As can be appreciated, the via 114 and trench 122 are filled with a conductive material during the same process thus saving one or more process steps when compared to the process necessary to form the structure as shown in FIG. 1. As will be noted, the semiconductor device 100 in FIG. 1 is the same as the semiconductor device 200 shown in the FIGS. 2A–2C.

The semiconductor device shown in FIG. 1 requires multiple steps to form the individual metal structures using the damascene method of forming metal filled vias and trenches. The semiconductor device shown in FIGS. 2A–2C requires extensive chemical mechanical polishing to remove excess copper that has been electroplated on the entire surface of the partially completed semiconductor device.

Therefore, what is needed is a method of manufacturing semiconductor devices that form multiple layers of metal filled vias and trenches in the minimum number of processes and that does not require extensive polishing processes.

SUMMARY OF THE INVENTION

According to the present invention, the foregoing and other objects and advantages are attained by a method of manufacturing a semiconductor device that utilizes an electroless plating process that has low cost, is conducted at a low temperature and that yields high purity copper film.

In accordance with an aspect of the invention, a partially completed semiconductor wafer having trenches and vias formed in a layer of interlayer dielectric has a barrier layer globally formed on the surface of the partially completed semiconductor wafer. A seed layer is globally formed on the surface of the barrier layer. The barrier and seed layers are removed from portions of the surface of the partially completed semiconductor wafer on which plating is not to occur. The partially completed semiconductor wafer is then subjected to an electroless plating process and conductive material is plated on those portions of the seed layer that remains on the partially completed semiconductor wafer.

In accordance with another aspect of the invention, the seed layer and barrier layer are removed from portions of the surface of the interlayer dielectric by a polishing process.

In accordance with still another aspect of the invention, the seed layer and barrier layer are removed from portions of the surface of the interlayer dielectric by self aligning masking portions of the surface of the interlayer dielectric and etching the seed layer and barrier layers from the surface of the interlayer dielectric.

The described method thus provides a method of manufacturing semiconductor wafers that utilizes the advantages of electroless plating of copper that has low cost, can be conducted at low temperature and that yields high purity copper film.

The present invention is better understood upon consideration of the detailed description below, in conjunction with the accompanying drawings. As will become readily apparent to those skilled in the art from the following description, there is shown and described embodiments of this invention simply by way of illustration of the best mode to carry out the invention. As will be realized, the invention is capable of other embodiments and its several details are capable of modifications in various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiments when read in conjunction with the accompanying drawings, wherein:

FIGS. 2A–2C show a prior art method of manufacturing semiconductor devices by global deposition or sputtering a conductive seed layer on the entire surface of the wafer and submerging the wafer into a bath of ionic solution containing copper ions that results in a thick layer of copper on the entire surface of the semiconductor wafer;

FIGS. 3A–3D show a method of manufacturing semiconductor devices in accordance with the present invention, wherein;

FIGS. 4A–4F show an alternative method of manufacturing semiconductor devices in accordance with the present invention, wherein portions of a seed layer formed on the surface of the semiconductor wafer on which copper is to be formed are masked and portions of the seed layer on which copper is not to be formed are removed, wherein;

DETAILED DESCRIPTION

Reference is now made in detail to specific embodiments of the present invention that illustrate the best mode presently contemplated by the inventors for practicing the invention.

Figure 3A:
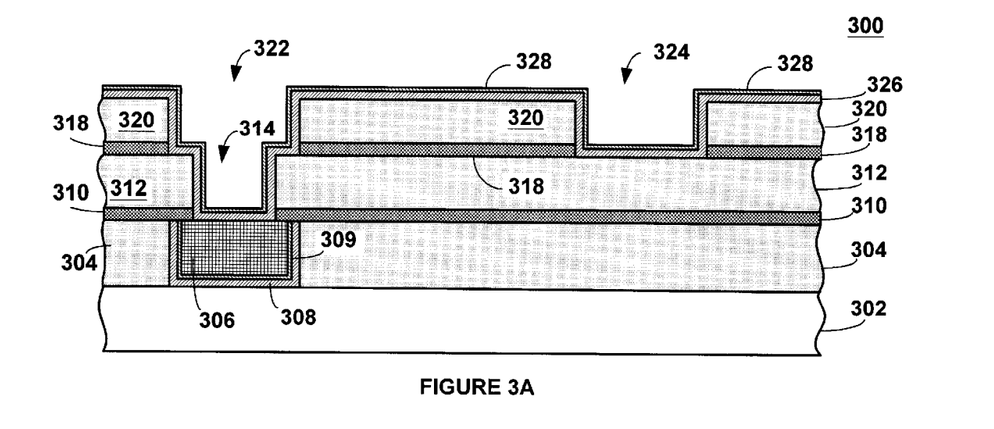
FIG. 3A shows a portion of a partially completed semiconductor wafer by forming a seed layer on the surface of the partially completed semiconductor wafer.

FIGS. 3A–3D show a method of manufacturing semiconductor devices in accordance with the present invention in which portions of the seed layer and barrier layer are removed from portions of the semiconductor wafer on which copper is not to be formed, wherein;

FIG. 3A shows a portion of a partially completed semiconductor wafer 300. The partially completed semiconductor device 300 shows a layer 302 with a metal structure 306 formed in a layer 304 of interlayer dielectric. The metal structure 306 is formed by forming a via or trench in the layer 304, forming a barrier layer 308 on the walls of the via or trench in the layer 304, and forming a seed layer 309 on the barrier layer 308 if the via or trench in the layer 304 is to be filled with copper. The via or trench is then filled with the appropriate conductive material to form the metal structure 306. The seal layer or hard mask layer 310, the layer 312 of interlayer dielectric, the seal layer or hard mask layer 318 and the layer 312 are formed on the layer 304. The layer 310 is a seal layer if the subsequent vias and trenches are to be filled with copper. A series of masking and etching processes are then conducted to form vias, such as the via 314 and trenches, such as the trenches 322 and 324, in the layers 304, 310, 312, 318, and 320. A barrier layer 326 is formed on the surface of the partially completed semiconductor wafer 300, including the walls of the vias and trenches. A seed layer 328 is formed on the barrier layer 326 of the partially completed semiconductor device 300. Typically, the seed layer 328 is typically a material such as copper. As discussed above, there are several methods to deposit copper, however, only two can successfully form copper into the small geometries required for modern semiconductor technology. These are chemical vapor deposition (CVD) and electroplating. Of the two, CVD is too expensive because of the gases used to supply the copper ions. Electroplating is preferred because an electroplating can be done in batches, unlike a CVD process, which can only be done on one wafer at a time.

When an electroplating process is utilized, a seed layer 328 is formed on the barrier layer 326 as described above. The present invention selectively deposits conductive material by means of electroless plating. Since electroless plating does not require a continuous sheet of seed layer as does electrolytic plating, the seed layer can be selectively placed where wires and vias are to be formed. The present invention will be discussed in relation to the use of copper electroless plating and a single damascene mask process. However, it is to be understood that the present invention is not limited to only copper and a single damascene process.

Figure 3B:
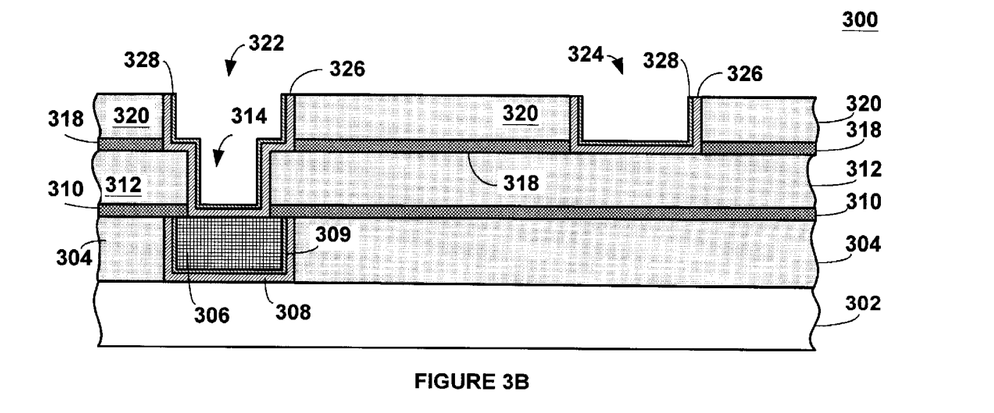
FIG. 3B shows the portion of the partially completed semiconductor wafer after a polishing process to remove portions of the seed layer and barrier layer from surfaces on which the metal layer is not to be formed.

FIG. 3B shows the partially completed semiconductor wafer 300 as shown in FIG. 3A after a polishing or buffing process to remove portions of the seed layer 328 and barrier layer 326 from surfaces of the semiconductor wafer 300 on which copper is not to be formed. As can be seen, the via or trench is recessed and will not be affected by the polishing and buffing process.

Figure 3C:
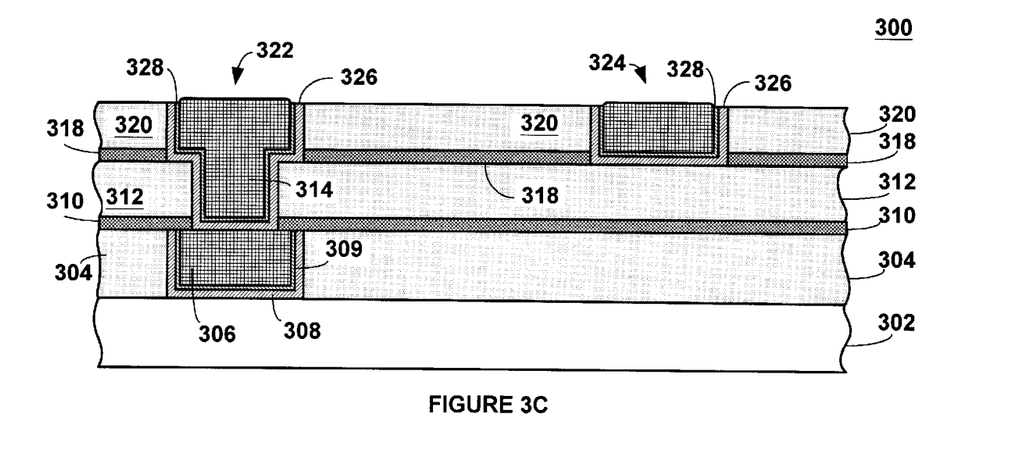
FIG. 3C shows the portion of the partially completed semiconductor wafer after trenches and vias in the partially completed semiconductor wafer have been filled with conductive material.

FIG. 3C shows the partially completed semiconductor wafer 300 as shown in FIG. 3B after an electroless plating process has been conducted to plate copper onto surfaces that have a seed layer, such as the via 314 and trenches 322 and 324.

Figure 3D:
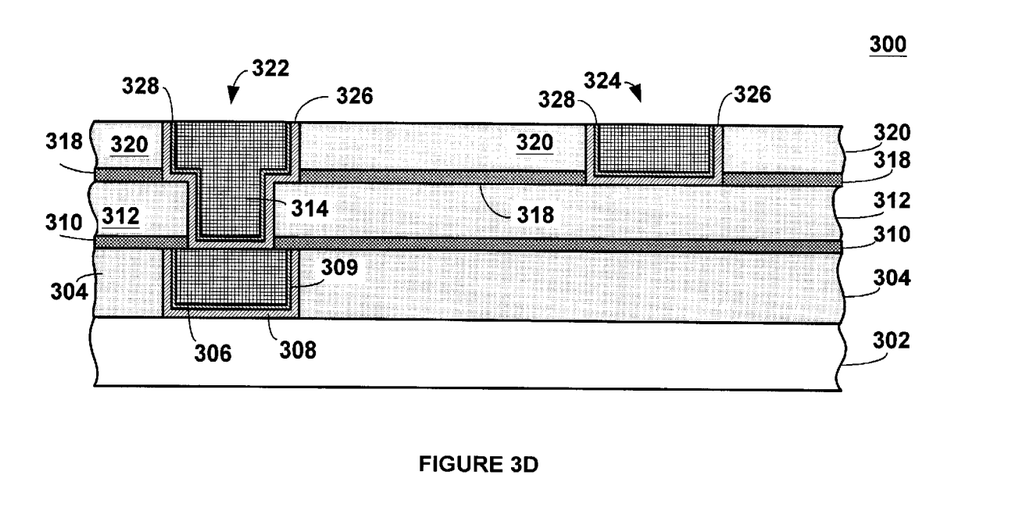
FIG. 3D shows the portion of the partially completed semiconductor wafer after excessive conductive material in the trenches have been polished.

FIG. 3D shows the partially completed semiconductor wafer 300 as shown in FIG. 3C after a polishing process to planarize the surface of the semiconductor wafer 300.

FIGS. 4A–4F show an alternate method of manufacturing semiconductor devices in accordance with the present invention, wherein portions of a seed layer formed on the surface of the semiconductor wafer on which copper is be formed are self aligned, masked and portions of the seed layer on which copper is not to be formed are removed.

Figure 4A:
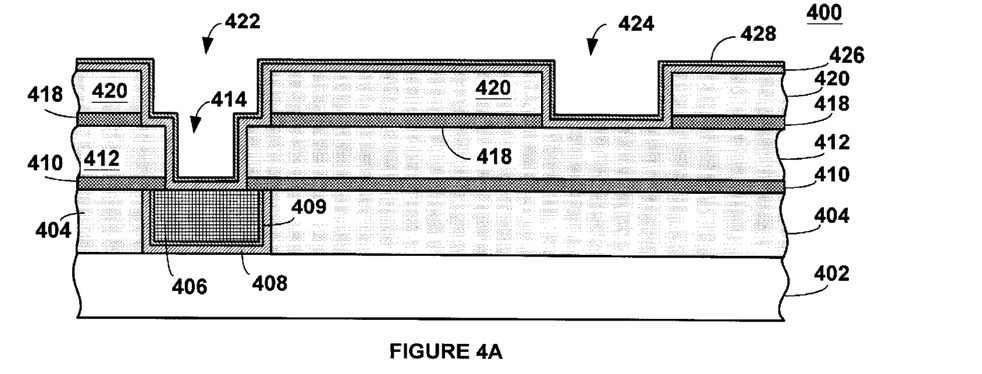
FIG. 4A shows a portion of a partially completed semiconductor wafer showing a seed layer formed on the surface of a the partially completed semiconductor wafer.

FIG. 4A shows a portion of a partially completed semiconductor wafer 400. The partially completed semiconductor device 400 shows the layer 402 with the metal structure 406 formed in the layer 404 of interlayer dielectric. The metal structure 406 is formed by forming a via or trench in the layer 404, forming a barrier layer 408 on the walls of the via or trench in the layer 404, and forming a seed layer 409 on the barrier layer 408 if the via or trench in the layer 404 is to be filled with copper. The via or trench is then filled with the appropriate conductive material to form the metal structure 406. The seal layer or hard mask layer 410, the layer 412 of interlayer dielectric, the seal layer or hard mask layer 418 and the layer 412 are formed on the layer 404. The layer 410 is a seal layer if subsequent vias and trenches to be formed will be filled with copper. A series of masking and etching processes are then conducted to form vias, such as the via 414 and trenches, such as the trenches 422 and 424, in the layers 404, 410, 412, 418, and 420. A barrier layer 426 is formed on the surface of the partially completed semiconductor wafer 400, including the walls of the vias and trenches. A seed layer 428 is formed on the barrier layer 426 of the partially completed semiconductor device 400. Typically, the seed layer 428 is typically a material such as copper. As discussed above, there are several methods to deposit copper, however, only two can successfully form copper into the small geometries required for modern semiconductor technology. These are chemical vapor deposition (CVD) and electroplating. Of the two, CVD is too expensive because of the gases used to supply the copper ions. Electroplating is preferred because an electroplating can be done in batches, unlike a CVD process, which can only be done on one wafer at a time. When an electroplating process is utilized, a seed layer 428 is formed on the barrier layer 426 as described above.

Figure 4B:
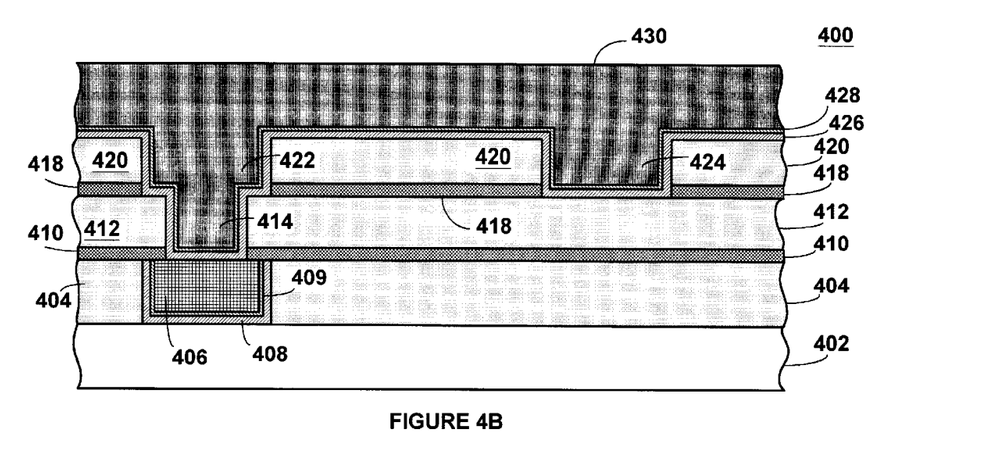
FIG. 4B shows the portion of the partially completed semiconductor wafer with a layer of photoresist formed on the surface of the partially completed semiconductor wafer.

FIG. 4B shows the partially completed semiconductor wafer 400 as shown in FIG. 4A after a layer 430 of a photo-sensitive or non-photo sensitive resist is formed on the surface of the partially completed semiconductor wafer 400.

Figure 4C:
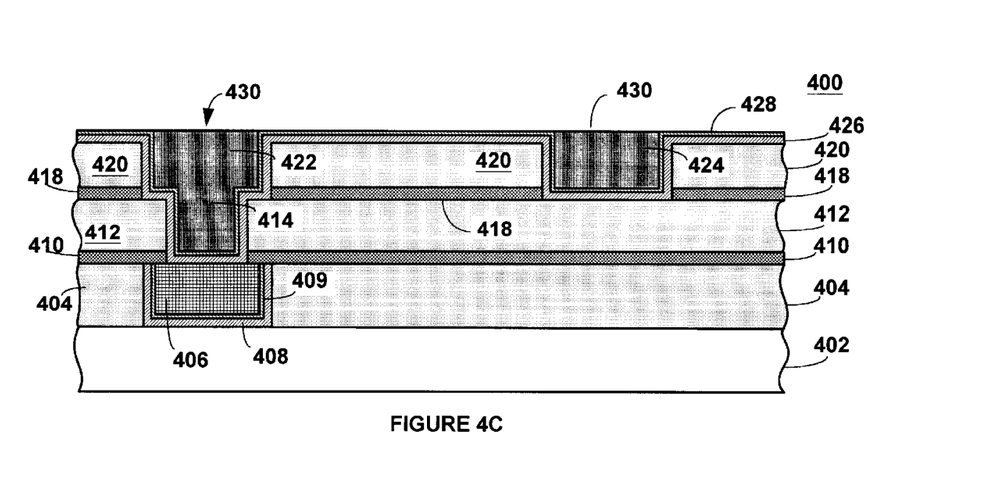
FIG. 4C shows the portion of the partially completed semiconductor wafer after the layer of photoresist has been removed from portions of the seed layer on which copper is not to be formed.

FIG. 4C shows the partially completed semiconductor wafer 400 as shown in FIG. 4B after the resist has been stripped from surfaces of the wafer 400 on which copper plating is not to be formed. Because of the thickness differences between the via/trench cavities and the surface, photoresist in the non-cavity regions are removed by anisotropic stripping method. The exposed seed and barrier layers are etched away.

Figure 4D:
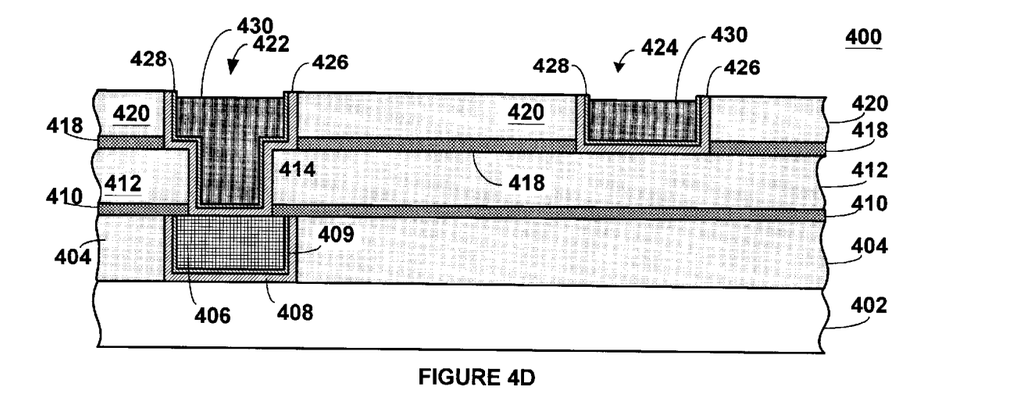
FIG. 4D shows the portion of the partially completed semiconductor wafer after the seed layer and the underlying barrier layer have been removed from those portions of the semiconductor wafer that are not protected by photoresist.

FIG. 4D shows the partially completed semiconductor wafer 400 as shown in FIG. 4C after an etch process to remove the seed layer 428 and the barrier layer 426 from the portions of the wafer 400 not protected by the layer 430 of resist.

Figure 4E:
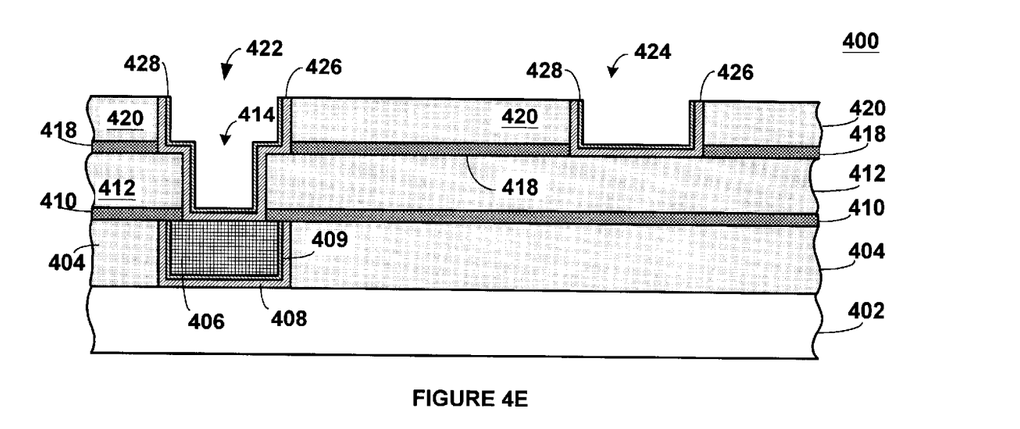
FIG. 4E shows the portion of the partially completed semiconductor wafer after the remaining photoresist has been removed.

FIG. 4E shows the partially completed semiconductor wafer 400 as shown in FIG. 4D with the remaining portions of the layer 430 of resist removed.

Figure 4F:
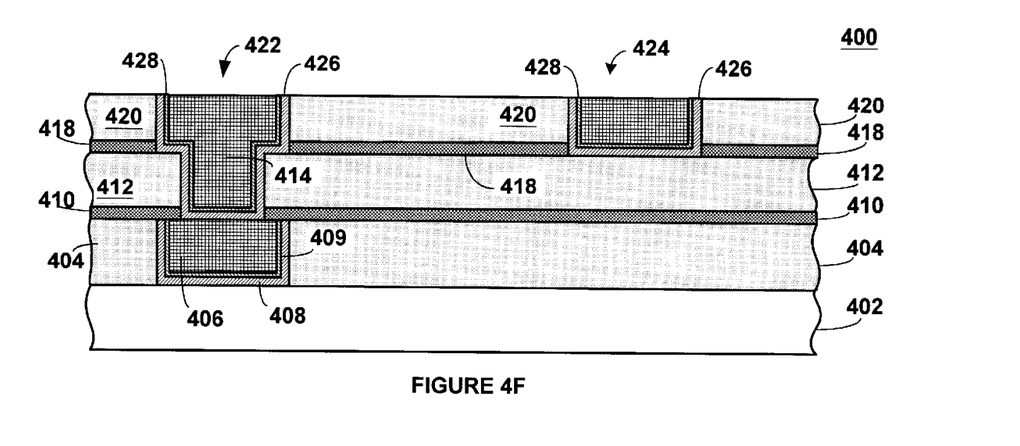
FIG. 4F shows the portion of the partially completed semiconductor wafer after the trenches and vias in the wafer have been filled with conductive material.

FIG. 4F shows the partially completed semiconductor wafer 400 as shown in FIG. 4F after the via 414 and the trenches 422 and 424 have been filled with a conductive material, such as copper.

The advantages of conductive material deposition, such as copper, by electroless plating are as follows:
1. conformal deposition,
2. low temperature,
3. high copper purity,
4. planar surfaces, and
5. low cost.

The basic mechanism for copper deposition by electroless plating is a two step reaction and is as follows:

1) Anodic oxidation of reducing agents on catalytic metal surface:

$$HCHO + 2OH^- = HCOO^- + 2H_2 + \tfrac{1}{2}H_2 + e^-$$

2) Cathodic reduction of copper ions on catalytic metal surface:

$$Cu^{2+} + 2e^- = Cu$$

The chemical components utilized are as follows:

| Chemicals | Function |
| --- | --- |
| copper sulfate | supplies Cu ions |
| TMAH | supplies OH⁻ ions |
| EDTH (ethylene diamine tetra acetic acid) | complexing agent |
| Formaldehyde | reducing agent |
| Ammonium cyanide | complexing agent |
| Surfactant | reduce surface tension and allow solution to reach small features |

The requirements for the seed material are as follows:
1. must be catalytically active for nucleation
2. must be conductive, and
3. must be non-oxidized, non-contaminated, and have a clean surface.

Suitable seed layer materials are as follows:
Palladium, Platinum, Nickel, Gold, Silver, Cobalt, Tungsten (ok/poor adhesion). The commonly used materials; Ti, TiN, Ta, and Al are not suitable as the seed layer. Tungsten is not catalytic, but galvanic displacement results in monolayer copper formation, thus initiating deposition. Therefore, if tungsten is used as a seed layer, it is essential that the surface is ultraclean.

The deposition conditions for the electroless plating of copper are as follows:

| | |
| --- | --- |
| Temperature 40–80° C. | (70° C. typical) |
| Deposition Rate: 150–300 Å/min | (200 Å/min typical) |
| pH value: must >12 | (12.5 typical) |
| Resistivity: | 2.0 micro ohms cm |
| Microstructure: | epitaxial growth on Cu, grain size - 0.1 μm. |

In summary, the results and advantages of the method of the present invention can now be more fully realized. The described method provides a method of manufacturing a semiconductor device that utilizes the advantages of electroless plating of copper that has low cost, can be conducted at low temperature and that yields high purity copper film.

The foregoing description of the embodiments of the invention has been presented for purposes of illustration and description. It is not intended to be exhaustive or to limit the invention to the precise form disclosed. Obvious modifications or variations are possible in light of the above teachings. The embodiments were chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method of manufacturing a semiconductor wafer, the method comprising:
   forming a partially completed semiconductor wafer having at least one trench formed in a layer of interlayer dielectric;
   forming a conformal barrier layer on a surface of the interlayer dielectric including walls of the at least one trench;
   forming a conformal seed layer on the barrier layer;
   forming a layer of photoresist on the conformal seed layer;
   patterning and developing the layer of photoresist exposing portions of the conformal seed layer;
   etching away the exposed portions of the conformal seed layer and the underlying conformal barrier layer thereby negating a requirement for a chemical mechanical polishing process;
   removing the layer of photoresist from the at least one trench; and
   filling the at least one trench with the conductive material by a method selected from the group of electroplating and electroless plating, wherein a top surface of the conductive material is substantially planar with the surface of the interlayer dielectric thereby negating a requirement for a chemical mechanical polishing process to remove excess conductive material.

2. The method of claim 1 wherein the step of filling the at least one trench with the conductive material is accomplished by filling the at least one trench with copper.

* * * * *